(12) United States Patent
Tsuji et al.

(10) Patent No.: US 8,106,411 B2
(45) Date of Patent: Jan. 31, 2012

(54) LIGHT EMITTING DEVICE

(75) Inventors: Masataka Tsuji, Tokyo (JP); Mahito Hamada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 234 days.

(21) Appl. No.: 12/424,423

(22) Filed: Apr. 15, 2009

(65) Prior Publication Data
US 2009/0284130 A1 Nov. 19, 2009

(30) Foreign Application Priority Data
Apr. 17, 2008 (JP) ................. 2008-108059

(51) Int. Cl.
*H01L 33/00* (2010.01)
*H05B 33/00* (2006.01)

(52) U.S. Cl. ............... 257/89; 257/88; 257/E25.028; 257/E25.019; 363/231

(58) Field of Classification Search ............ 257/79, 257/88, 89, 685, 13, E25.028, E2.019; 313/502, 313/312; 362/231, 240, 227
See application file for complete search history.

(56) References Cited

U.S. PATENT DOCUMENTS
6,054,716 A 4/2000 Sonobe et al.
2002/0001192 A1* 1/2002 Suehiro et al. ............. 362/240
2006/0180818 A1* 8/2006 Nagai et al. ................ 257/89
2007/0090375 A1* 4/2007 Kobilke ..................... 257/89

FOREIGN PATENT DOCUMENTS
JP 11-54804 A 2/1999
JP 2001-196638 A 7/2001

* cited by examiner

*Primary Examiner* — Thomas L Dickey
*Assistant Examiner* — Nikolay Yushin
(74) *Attorney, Agent, or Firm* — Kenealy Vaidya LLP

(57) ABSTRACT

A light emitting device made in accordance with principles of the disclosed subject matter can provide countermeasures against static electricity and can be configured in a relatively small size. The lighting emitting device can include both a first conductor pattern and a second conductor pattern on an insulating board. In one example, a first LED chip having a high electrostatic breakdown voltage is electrically connected to the first conductor pattern and a second LED chip having a low electrostatic breakdown voltage is electrically connected to the second conductor pattern. The LED chips can be encapsulated with an encapsulating resin on the insulating board. At least part of the first conductor pattern is exposed at a farther position than a furthest portion of the second conductor pattern from a mounting surface so as to act as a lightning rod. Thus, the second LED chip having a low electrostatic breakdown voltage can be protected from static electricity by the first conductor pattern that is connected to the first LED chip.

13 Claims, 9 Drawing Sheets

LIGHT EMITTING DEVICE

This application claims the priority benefit under 35 U.S.C. §119 of Japanese Patent Application No. 2008-108059 filed on Apr. 17, 2008, which is hereby incorporated in its entirety by reference.

BACKGROUND

1. Field

The presently disclosed subject matter relates to light emitting devices using at least one LED, and more particularly to a reliable light emitting device having a countermeasure against static electricity with the possibility of being manufactured in a small size, and which can be configured to emit light in parallel with a mounting surface thereof (e.g. a side view type LED device).

2. Description of the Related Art

Electronic devices have recently become thinner and generally downsized in keeping with the trend of miniaturization in electronic products such as a mobile phones, personal computers, audio players, etc. When these electronic devices are mounted on a circuit board, light emitting devices have become a relatively high-height part in comparison with other electronic devices.

Therefore, when static electricity is generated around the circuit board, static electricity may be attracted to the high-height light emitting device. If the light emitting device has a low electrostatic breakdown voltage, the light emitting device may be damaged by static electricity and the electronic products that include the light emitting device may also become defective.

As a method for preventing a light emitting device from damage caused by a forward overvoltage and/or a reverse overvoltage that may be generated by static electricity, an LED device including a protective element is disclosed in Patent Document No. 1 (Japanese Patent Application Laid Open H11-054804). FIG. 8(A) is a cross-section view depicting a conventional LED device disclosed in Patent Document No. 1.

The conventional LED device includes: a circuit board that is made by forming conductor patterns 11, 12 on surfaces of an insulating board 10; an LED chip 13 mounted on the conductor pattern 11; bonding wires 14 for connecting electrodes of the LED chip 13 to the conductor patterns 11, 12; a zener diode 15 mounted on the conductor pattern 12 and electrically connected to the conductor patterns 11, 12 in parallel with the LED chip 13; and an encapsulating resin 16 disposed in a cavity 19 formed on the circuit board.

FIG. 8(B) is a circuit diagram showing a relation between the LED chip 13 and the zener diode 15 that is used as the protective element. The zener diode 15 can have current that flows not only in the forward direction like a normal diode but also in the reverse direction when the applied voltage is larger than the zener voltage. Thus, the zener diode 15 can prevent the LED device 13 from damage caused by both forward overvoltage and reverse overvoltage that may be generated by static electricity.

However, the conventional LED device includes certain features and problems, such as an increase of the cost for the protective element, an increase in steps of the manufacturing process for mounting the protective element, an enlargement of the space, etc. In addition, the protective element may cause a negative effect in light distribution characteristics of the LED device.

Therefore, a protective device for an LED device without the above-referenced protective element is disclosed in Patent Document No. 2 (Japanese Patent Application Laid Open JP2001-196638). FIG. 9(A) is a partial top view depicting a protective device for an LED device disclosed in Patent Document No. 2.

The protective device includes: a circuit board 24 being formed a conductor pattern 23 on a surface of an insulating board 22; an LED device 21 mounted on the circuit board 24 by connecting lead wires 21a thereof to conductor patterns of the circuit board 21; and an electric conductor 25 electrically connected to the conductor pattern 23 of the circuit board 24 so as to surround the LED device 21 therein.

In this case, the electric conductor 25 can maintain an electric potential of ground because the conductor pattern 23 is connected to ground. Thus, because the surface around the LED device 21 located in the electric conductor 25 may maintain an electric potential of ground even if static electricity is generated around the circuit board 24, the protective device can prevent the LED device 21 from problems caused by static electricity.

The conventional protective device may result in the mounting portion of the LED device 21 being relatively huge because the mounting height must become higher than both heights of the circuit board 23 and the LED device 21, and the additional round conductor is also located on the circuit board 24. In addition, the surface underneath the LED device 21 may cause a negative effect such as an unnecessary reflection in light distribution characteristics for the LED device 21.

FIG. 9(B) is a partial top view depicting a variation in the protective device shown in FIG. 9(A). In the protective device shown in FIG. 9(B), an electric conductor 26 is formed in a U-shape and the surface under the LED device 21 is eliminated. Therefore, the negative effects in the protective device shown in FIG. 9(A) may be reduced.

However, because the above-described protective devices include electric conductors 25, 26 on the circuit board 22, the LED device 21 may be limited to certain locations on the circuit board 22. Moreover, because the LED device 21 may be difficult to mount on a surface of the circuit board 22, it may be difficult to make the mounting portion thin and the mounting structure may become a weak structure relative to shock, vibration, etc.

The above-referenced Patent Documents are listed below, and are hereby incorporated with their English abstracts in their entireties.

1. Patent Document No. 1: Japanese Patent Application Laid Open H11-054804
2. Patent Document No. 2: Japanese Patent Application Laid Open JP2001-196638

The disclosed subject matter has been devised to consider the above and other problems and characteristics. Thus, according to an aspect of the disclosed subject matter a reliable light emitting device can include a countermeasure against static electricity and can be mounted on a surface of a circuit board and can be miniaturized.

SUMMARY

The presently disclosed subject matter has been devised in view of the above and other features, characteristics and problems. An aspect of the disclosed subject matter includes providing reliable light emitting devices including a plurality of LED chips and including protection against static electricity, in which at least part of a conductive pattern for mounting an LED chip having a high electrostatic breakdown voltage can be exposed at a position farther than a position at which another conductive pattern for mounting an LED chip having a low electrostatic breakdown voltage is located, at least with respect to a distance towards a mounting surface thereof so as to create a lightning rod effect. Another aspect of the disclosed subject matter includes providing light emitting devices with high reliability against static electricity even when the devices do not include an LED chip having a high electrostatic breakdown voltage or different relative electrostatic breakdown voltages.

According to an aspect of the disclosed subject matter, a light emitting device can include: an insulating board having a mounting surface and a front surface and a rear surface, both the front surface and the rear surface thereof being substantially perpendicular to the mounting surface; a first conductor pattern having a cathode electrode and an anode electrode that are formed on the front surface, and being configured to extend substantially to the mounting surface of the insulating board so as to be exposed close to the mounting surface for receiving a power supply via a circuit board; and at least one second conductor pattern having a cathode electrode and an anode electrode that are formed on the front surface of the insulating board, and being configured to extend substantially to the mounting surface of the insulating board so as to be exposed close to the mounting surface for receiving a power supply via the circuit board.

The light emitting device can also include: a first LED chip having an electrostatic breakdown voltage mounted on the front surface of the insulating board, a cathode thereof electrically connected to the cathode electrode of the first conductor pattern, and an anode thereof electrically connected to the anode electrode; at least one second LED chip having an electrostatic breakdown voltage mounted on the front surface of the insulating board, a cathode thereof electrically connected to the cathode electrode of the at least one second conductor pattern, and an anode thereof electrically connected to the anode electrode; and an encapsulating resin located so as to encapsulate both the first LED chip and the at least one second LED chip on the front surface, wherein the electrostatic breakdown voltage of the first LED chip is higher than that of the at least one second LED chip and at least part of one electrode of the first conductor pattern is configured to be exposed at a farther position than the at least one second conductor pattern in a direction towards the mounting surface of the insulating board.

In the above-described exemplary light emitting device, the first LED chip that is connected to the first conductor pattern can be independent with respect to the at least one second LED chip that is connected to the at least one second conductor pattern. The one electrode of the first conductor pattern that is exposed at a farther position than the at least one second conductor pattern in a direction towards the mounting surface can be the cathode electrode that is connected to ground of a power supply via the circuit board. In addition, the first LED chip can be composed of an AlGaInP-based compound semiconductor and the at least one second LED chip can be composed of a GaN-based compound semiconductor.

According to the above-described exemplary light emitting device, because the first conductor pattern that is connected to the first LED chip having a high electrostatic breakdown voltage can act as a lightning rod and be exposed at a farther position than the second conductor pattern that is connected to the second LED chip in a direction towards the mounting surface, the second LED chip having low electrostatic breakdown voltage can be protected from static electricity. When the first conductor pattern is connected to ground of a power supply via the circuit board, because static electricity may not be generated around the first conductor pattern, the first conductor pattern can prevent the second LED chip from damage caused by static electricity with high confidence.

Another of the aspects of the disclosed subject matter includes a light emitting device that can include: an insulating board having a mounting surface and a front surface and a rear surface, both the front surface and the rear surface thereof being substantially perpendicular to the mounting surface; a first conductor pattern formed on the front surface of the insulating board, and being configured to extend substantially to the mounting surface so as to be exposed close to the mounting surface for electrically connecting to ground of a power supply via a circuit board; and at least one second conductor pattern having a cathode electrode and an anode electrode that are formed on the front surface of the insulating board, and being configured to extend substantially to the mounting surface so as to be exposed close to the mounting surface for receiving a power supply via the circuit board.

The light emitting device can also include: at least one LED chip mounted on the front surface of the insulating board, a cathode thereof electrically connected to the cathode electrode of the at least one second conductor pattern, and an anode thereof electrically connected to the anode electrode; and an encapsulating resin located so as to encapsulate the at least one LED chip on the front surface of the insulating board, wherein at least part of the first conductor pattern can be configured to be exposed at a farther position than the at least one second conductor pattern in a direction towards the mounting surface. In this case, the first conductor pattern can be connected to ground of a power supply via the circuit board and the at least one second LED chip can be composed of a GaN-based compound semiconductor.

According to the above-described exemplary light emitting device, the first conductor pattern that is connected to ground of a power supply via a circuit board can be exposed as a lightning rod at a farther position relative to the mounting surface than the second conductor pattern. Thus, the LED chip having low electrostatic breakdown voltage can be protected from static electricity because static electricity may not be generated around the first conductor pattern in case of mounting the light emitting device on the circuit board.

In the above-described exemplary light emitting devices, the encapsulating resin can be composed of at least one of a transparent resin and a mixture resin, and the mixture resin can include a resin mixed with at least one of a diffuser, a wavelength conversion material such as a phosphor, and a pigment for selectively absorbing light having a predetermined wavelength. Thus, the above-described exemplary light emitting device can emit various uniform color lights while maintaining a high reliability against static electricity.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1:
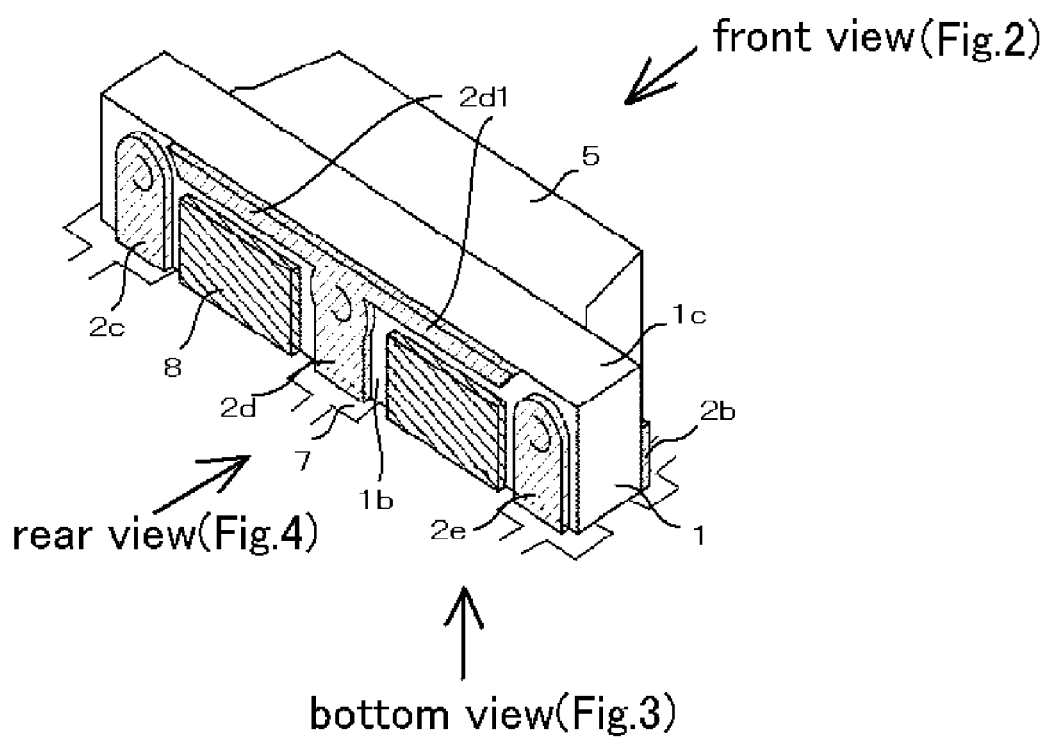
FIG. 1 is a schematic perspective view showing a light emitting device in accordance with a first exemplary embodiment of the disclosed subject matter.
Figure 2:
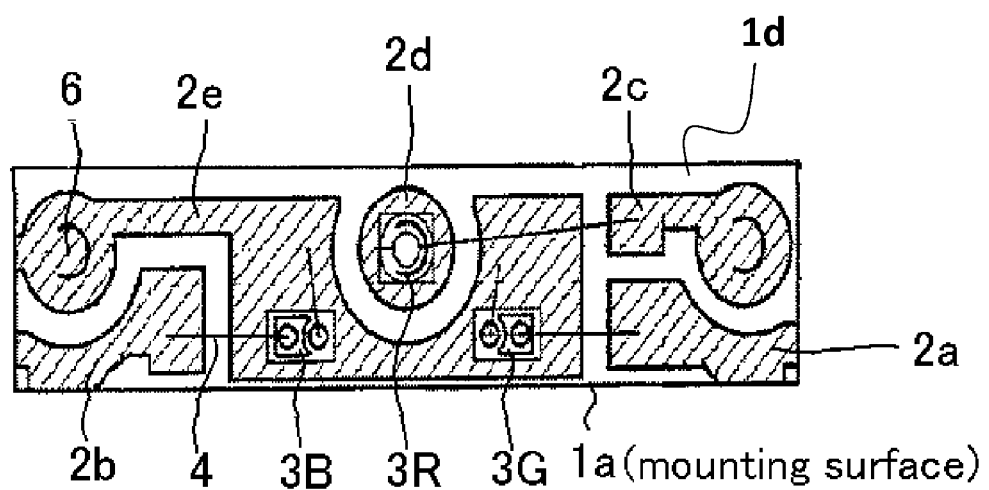
FIG. 2 is a schematic closeup front view of a portion of the light emitting device shown in FIG. 1.
Figure 3:
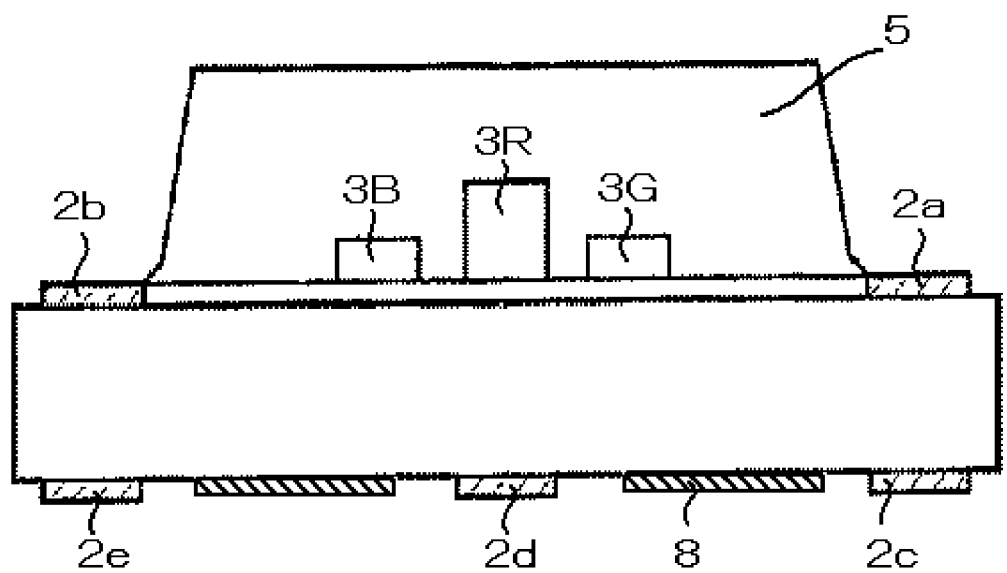
FIG. 3 is a schematic bottom cross-section view showing the light emitting device shown in FIG. 1.
Figure 4:
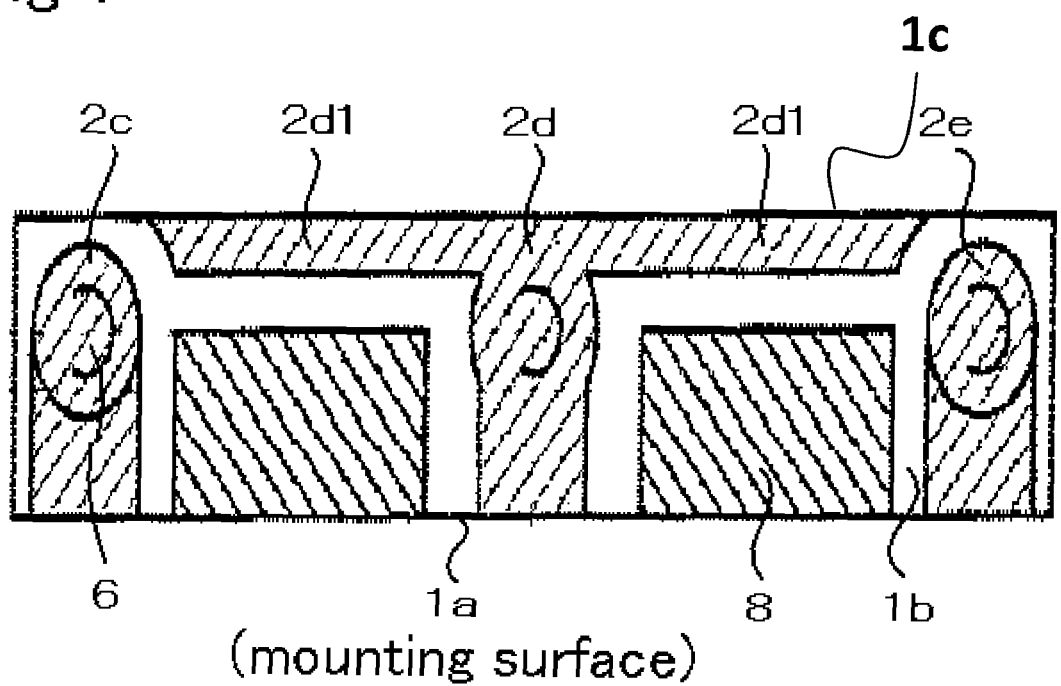
FIG. 4 is a schematic rear view showing the light emitting device shown in FIG. 1.

A first exemplary embodiment of the disclosed subject matter will now be described in detail with reference to FIGS. 1-5. FIG. 1 is a schematic perspective view showing a light emitting device in accordance with a first exemplary embodiment of the disclosed subject matter. FIG. 2 is a schematic closeup front view of both conductive patterns and LED chips mounted on the patterns in the light emitting device shown in FIG. 1. FIGS. 3 and 4 are a schematic bottom cross-section view and a schematic rear view showing the light emitting device shown in FIG. 1, respectively.

The light emitting device of the first exemplary embodiment can include: an insulating board 1 based on a resin; conductor patterns 2a-2e that are formed on surfaces of the insulating board 1; a plurality of LED chips 3R, 3B, 3G that can each be mounted on the insulating board 1 that includes the conductor patterns 2a-2e; and an encapsulating resin 5 for encapsulating the plurality of LED chips 3.

The insulating board 1 can be made from various materials including, for instance, resins, including glass epoxy, paper epoxy, paper phenol, etc. The thickness of the insulating board 1 can be between around 0.03 mm to around 0.5 mm, and a thick glass epoxy board of between 0.5 mm and 1.6 mm can also be used as the insulating board 1.

A side surface of the insulating board 1 can be used as a mounting surface 1a for mounting the light emitting device on a circuit board in electronic products. The insulating board 1 can include both a front surface 1d and a rear surface 1b that are substantially perpendicular to the mounting surface 1a, and also can include a top surface 1c opposite the mounting surface 1a.

The conductor patterns 2a-2e can be composed of metal layers that are made by forming plating layers (e.g. Cu/Ni/Au) on a Cu layer and the thickness thereof can be approximately 0.03 mm. However, the conductor patterns 2a-2e can be formed thicker than 0.03 mm on the above-described surfaces of the insulating board 1 and can be configured in accordance with the thickness of the insulating board 1, properties of the LED chips mounted thereon, etc. The conductor patterns 2a-2e in the first exemplary embodiment can be composed of five patterns 2a, 2b, 2c, 2d and 2e as shown in FIG. 2.

When the light emitting device is mounted on the circuit board, the mounting surface 1a of the light emitting device may be placed on the predetermined position of the circuit board as shown in FIG. 1. After that, the light emitting device can be attached to the circuit board by soldering the above-described conductor patterns 2a, 2b, 2c, 2d and 2e to circuit patterns 7 of the circuit board near the mounting surface 1a, respectively.

Thus, each of the conductor patterns 2a-2e can extend to the mounting surface 1a and can be exposed close to the mounting surface 1a. The conductor patterns 2a-2e can be electrically connected to the respective circuit patterns 7 of the circuit board while the light emitting device can also thus be attached to the circuit patterns 7 of the circuit board. In this case, surfaces that may not be soldered can be covered with a resist coating 8 in order to prevent from a short circuit between each of the conductor patterns 2a-2e in the soldering process. The coating surfaces can include the surfaces of the insulating board 1 that are exposed to the outside, and also can include each surface of the conductor patterns 2a-2e.

The plurality of LED chips 3R, 3G, 3B can be mounted on the front surface 1d and the conductor patterns 2 of the insulating board 1. In the light emitting device of the first exemplary embodiment, the plurality of LED chips can be composed of a red LED chip 3R mounted on the conductor pattern 2d, and a blue LED chip 3B and a green LED chip 3G mounted on the conductor pattern 2e of the front surface 1d as shown in FIG. 2.

In this case, when each of the LED chips has a bottom electrode on a bottom surface thereof, each bottom electrode of the LED chips can be electrically connected to each of the conductor patterns 2d and 2e via an adhesive material including a conductive material (e.g. Ag) at the same time. Alternatively, when the LED chips have top electrodes on a top surface thereof, each top electrode of the LED chips 3R, 3G and 3B can be electrically connected to each of the conductor patters 2d and 2e via bonding wires 4 (e.g. Au wire), respectively. Each other electrode located on the top surfaces of the LED chips 3R, 3G and 3B can be electrically connected to the conductor patterns 2c, 2a and 2b via bonding wires 4, respectively.

The above-described conductor patterns 2a, 2b, 2c, 2d and 2e can be formed on a front surface 1d of the insulating board 1, in which the front surface 1d can be located perpendicular to the mounting surface 1a thereof. Thus, when current flows between each electrode of the LED chips 3R, 3B, and 3G from a power supply via the circuit board after mounting the light emitting device on the circuit board, the LED chips can emit each color light in parallel with the mounting surface 1a, that is to say, parallel with the circuit board.

In this case, the red LED chip 3R may be generally composed of an AlGaInP-based compound semiconductor of which electrostatic breakdown voltage may be more than 1,000V Both the blue LED chip 3B and the green LED chip 3G can be generally composed of a GaN-based compound semiconductor having a low electrostatic breakdown voltage of around 100V. Thus, the red LED chip 3R might not be broken or adversely affected by static electricity that is usually generated in the manufacturing process, during operation or use of electronic devices, etc. However, the LED chips 3B and 3G that may be composed of GaN may be more easily affected or broken by static electricity due to low electrostatic breakdown voltage.

Each anode of the LED chips 3G, 3B can be electrically connected to the common conductor pattern 2e. The conductor pattern 2e can extend to a rear surface 1b of the insulating board 1 via a through hole 6 and can extend to the mounting surface 1a as show in FIG. 4. The conductor pattern 2a that is connected to the cathode of the blue LED chip 3B can extend towards an edge of the front surface 1d and can extend to the mounting surface 1a as shown in FIG. 2. The conductor pattern 2b that is connected to the cathode of the green LED chip 3G can extend towards another edge opposite the edge of the front surface 1d and can extend to the mounting surface 1a.

The red LED chip 3R can be mounted on the conductor pattern 2d that is located on the front surface 1d of the insulating board 1 as described above. The conductor pattern 2d can be electrically connected to the cathode of the LED chip 3R (which has a high electrostatic breakdown voltage) and can extend to the rear surface 1b of the insulating board 1 via a through hole 6 as shown in FIG. 4. The conductor pattern 2d can extend to the mounting surface 1a and also can extend to a top surface 1c opposite the mounting surface 1a of the insulating board 1.

In addition, the conductor pattern 2d can extend in directions towards both the conductor pattern 2e that is connected to the common anode of the LED chips 3G, 3B and the conductor pattern 2c. The conductor pattern 2d can extend along an edge of the top surface 1c as shown at marks 2d1 in FIG. 4. In this case, at least the conductor pattern 2d that is located along the edge of the top surface 1c cannot be covered with the resist coating 8 but can be exposed to the outside.

In the above-described conductor pattern, the conductor pattern 2c that is located on the front surface 1d of the insulating board 1 can be electrically connected to the anode of the red LED chip 3R and can extend to the rear surface 1b via a through hole 6. The conductor pattern 2c can extend to the mounting surface 1a in order to facilitate soldering or other attachment to the circuit pattern of the circuit board. The conductor patterns that are located near the above-described through holes can be covered with the resist coating 8 if it is not necessary to solder to the circuit pattern of the circuit board.

Figure 5:
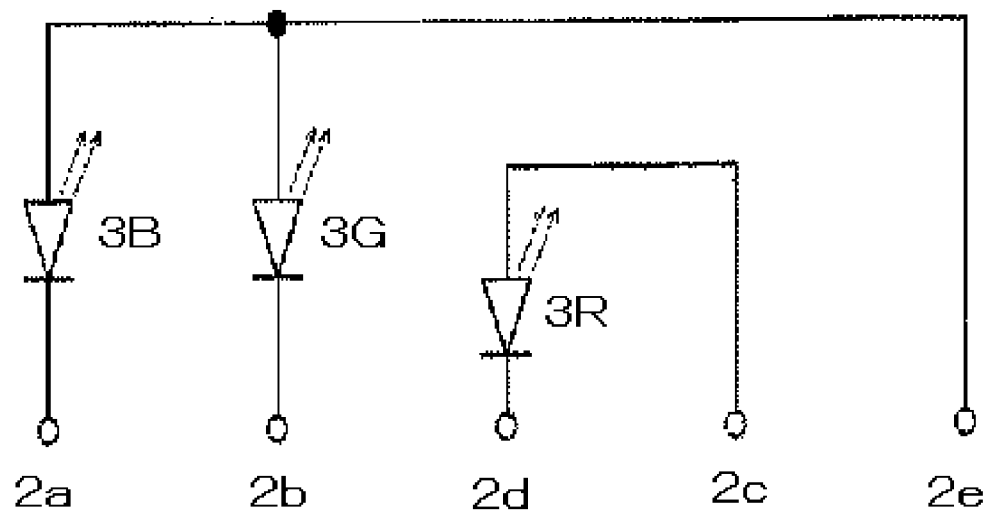
FIG. 5 is a circuit diagram showing an electric circuit for the light emitting device shown in FIG. 1.

Thus, the LED chips 3R, 3G and 3B may be located/positioned in a top view of the light emitting device as shown in FIG. 3. FIG. 5 is a circuit diagram showing a possible electric connection of the LED chips in the light emitting device. Each of the reference numbers shown in FIG. 5 corresponds to each respective element associated with the reference numerals of FIGS. 1 to 4.

The blue LED chip 3B and the green LED chip 3G can be connected in parallel while their anodes are connected to the common conductor pattern 2e. Each cathode of the blue LED chip 3B and green LED chip 3G can be independently connected to the conductor patterns 2a and 2b, respectively. Each of the anode and cathode of the red LED chip 3R can be connected to each of the conductor patterns 2c and 2d, and therefore the red LED chip 3R (which has high electrostatic breakdown voltage) can be separated from the circuit of the LED chips 3G and 3B (which has low electrostatic breakdown voltages) in the light emitting device.

However, the conductor patterns 2a, 2b, 2e can be connected to ground of a power supply via the circuit board, because each of the conductor patterns 2a, 2b and 2e are connected to each cathode of their LED chips 3B, 3G and 3R. In this case, static electricity may not be generated on at least the conductor patterns 2a, 2b, 2e of the insulating board 1.

The encapsulating resin 5 will now be described with reference to FIG. 3. The above-described LED chips 3R, 3G, 3B, the bonding wires and at least a part of the conductor patterns 2a-2e located on the front surface 1d can be encapsulated with the encapsulating resin 5. The encapsulating resin 5 can be composed of at least one of a transparent resin and a mixture resin, and the mixture resin can include a resin mixed with at least one of a diffuser, a phosphor, and a pigment for selectively absorbing light having a predetermined wavelength. An epoxy resin or a silicon resin, etc. can be used for the transparent resin.

Therefore, the light emitting device can emit at least one colored light of the various lights emitted from the LED chips 3R, 3G and 3B to the outside and also can emit wavelength-converted light including various color lights to the outside via the encapsulating resin 5 of the mixture resin. In addition, the encapsulating resin 5 can prevent the LED chips 3R, 3G and 3B from experiencing problems caused by external factors such as vibration, shock, dust, dampness, etc.

More specifically, when the transparent resin is used as the encapsulating resin 5, the light emitting device can emit the following types of light: a yellow light derived from an additive combination of colors including light emitted by both the green LED chip 3G and the red LED chip 3R; a purple light derived from an additive combination of colors including light emitted by both the red LED chip 3R and the blue LED chip 3G; and a cyan light derived from an additive combination of colors including light emitted by both the green LED chip 3G and the blue LED chip 3G. When the LED chips 3R, 3G and 3B are each activated to fully emit light, the light emitting device can emit a white light by an additive combination of three primary colors.

In the above described cases, the encapsulating resin 5 can include a diffuser (e.g. $CaCO_3$) which can accelerate the above-described additive combination of color and therefore the encapsulating resin 5 can result in a uniform color light in various color lights emitted from the light emitting device. When the phosphor is mixed with the encapsulating resin 5, the color rendering index of the white light can be adjusted and also the number of their LED chips can be reduced.

For example, when white light is emitted from the light emitting device, the blue light emitted from the LED chip 3B can be converted into white light with an encapsulating resin 5 that includes both a red phosphor (e.g. SrS:Eu) and a green phosphor (e.g. $SrGa_2S_4$:Eu), for example. The blue light can also be converted into white light with an encapsulating resin 5 that includes a yellow phosphor (e.g. YAG:Ce), for example. In these cases, the encapsulating resin 5 can includes the diffuser which can accelerate the additive combination of color and therefore the encapsulating resin 5 can result in a uniform white light.

When the above-described LED chips 3R, 3G, 3B, the bonding wires, and a part of conductor patterns 2a-2e that are located on the front surface 1d are encapsulated with the encapsulating resin 5, the insulating board 1 can be placed in a mold, and the LED chips and the like can be encapsulated with the encapsulating resin 5 in the mold by way of resin transfer molding. The encapsulating resin 5 can also be disposed on the front surface 1d by a dispenser, etc.

Parts of the conductor patterns 2a and 2b that are not covered with the encapsulating resin 5 on the front surface 1d can be soldered to the circuit patterns of the circuit board. Because the rear surface 1b is not necessarily covered with the encapsulating resin 5, the conductor patterns 2c, 2d and 2e can be soldered to the circuit patterns of the circuit board. In this case, the conductor pattern 2d can be located at the farthest position with respect to the conductor patterns 2a-2e in a direction towards the mounting surface 1 and can include the conductor pattern 2d1 that is exposed to the outside on the rear surface 1b along the edge of the top surface 1c.

When static electricity is generated around the circuit board, static electricity may be easily applied or transferred to the conductor pattern 2d and therefore may not be applied to or transferred by the other patterns, which are connected to the LED chips 3G and 3B which have low electrostatic breakdown voltages. That is to say, the conductor pattern 2d can act as a lightning rod because the pattern 2d can extend widely while being exposed to the outside along the edge of the top surface 1c. Thus, the conductor pattern 2d can prevent the LED chips 3G and 3B from damage caused by static electricity, and the LED chip 3R that is connected to the conductor pattern 2d may not be damaged by static electricity because of the high electrostatic breakdown voltage characteristic as described above.

When the conductor pattern 2d is connected to ground of a power supply via the circuit board, because static electricity may not be generated around the conductor pattern 2d, the LED chips 3G and 3B can be protected from static electricity. The conductor pattern 2d may not be connected to the ground in some cases. However, the LED chips 3R, 3G and 3B may not be damaged by static electricity even in the case as described above.

In addition, the red LED chip 3R which has a high electrostatic breakdown voltage can be connected independently with respect to LED chips 3G, 3B in the light emitting device. The independent circuit of the red LED 3R can prevent the LED chips 3G, 3B which have relatively low electrostatic breakdown voltages (as compared to the red LED chip 3R) from problems caused by static electricity with high confidence, even when static electricity is applied to the red LED chip 3R in the light emitting device.

Therefore, the conductor patterns 2c and 2d can also be connected to the anode and the cathode of the red LED chip 3R, respectively. One of the conductor patterns 2c and 2d can also become a common pattern with one pattern of other LED chips 3G and 3B. In addition, the red LED chip 3R can be replaced with other LED chip if the other LED chip has a higher electrostatic breakdown voltage than those of the LED chips 3G, 3B.

Figure 6A:
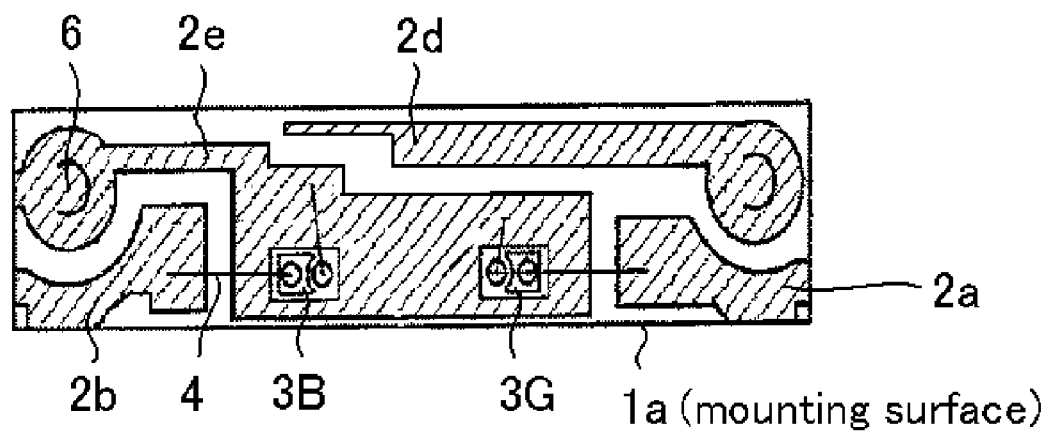
FIGS. 6(A) and (B) are respectively a schematic closeup front view and a schematic rear view of a portion of a light emitting device in accordance with a second exemplary embodiment of the disclosed subject matter.
Figure 6B:
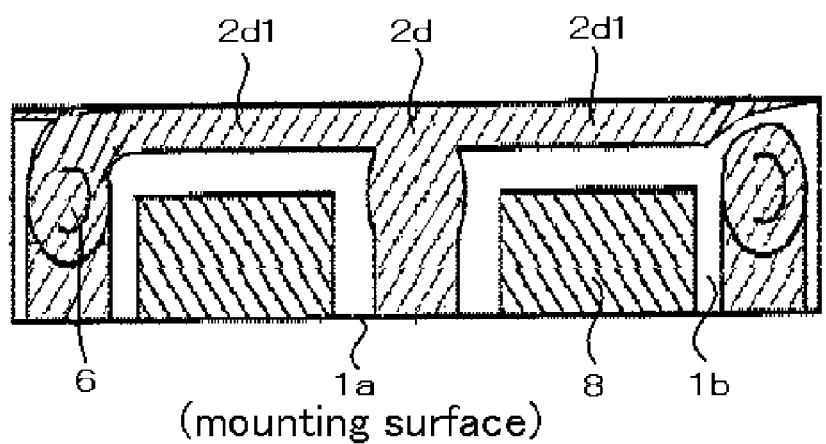

A second exemplary embodiment of the disclosed subject matter will now be described in detail with reference to FIGS. 6A-7B. FIGS. 6(A) and (B) are respectively a schematic closeup front view and a schematic rear view of a portion of a light emitting device in accordance with a second exemplary embodiment of the disclosed subject matter.

Differences between the first exemplary embodiment and the second exemplary embodiment are a nonexistence of the red LED chip 3R having a high electrostatic breakdown voltage and a connection between the conductor patterns 2c and 2d that are connected to the LED chip 3R. The conductor pattern 2d shown in FIGS. 6(A) and 6(B) can be connected to ground of a power supply via the circuit board when mounting the light emitting device on the circuit board.

In this case, because the conductor pattern 2d can act as a lightning rod to prevent static electricity from being generated around the conductor pattern 2d, the LED chips 3G, 3B can be protected from static electricity. Thus, the second exemplary embodiment can be useful when the light emitting device does not include an LED chip having a high electrostatic breakdown voltage.

Figure 7A:
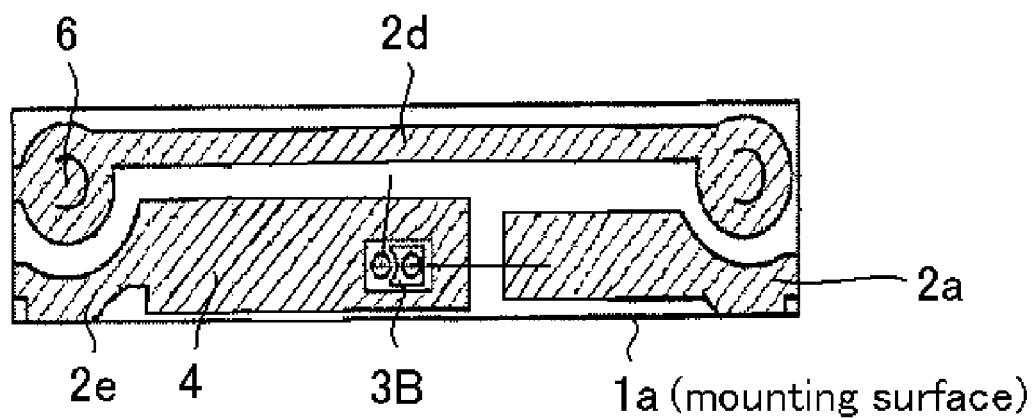
FIGS. 7(A) and (B) are a schematic closeup front view and a schematic rear view of a variation of the second exemplary embodiment shown in FIGS. 6(A) and (B), respectively.
Figure 7B:
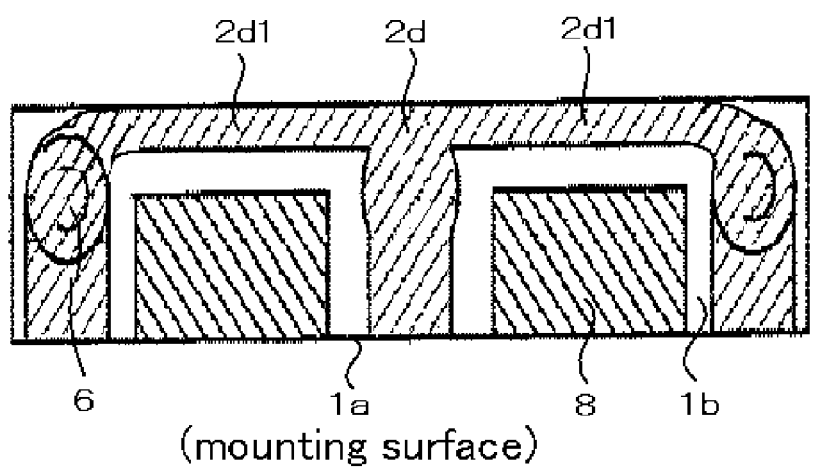
Figure 8A:
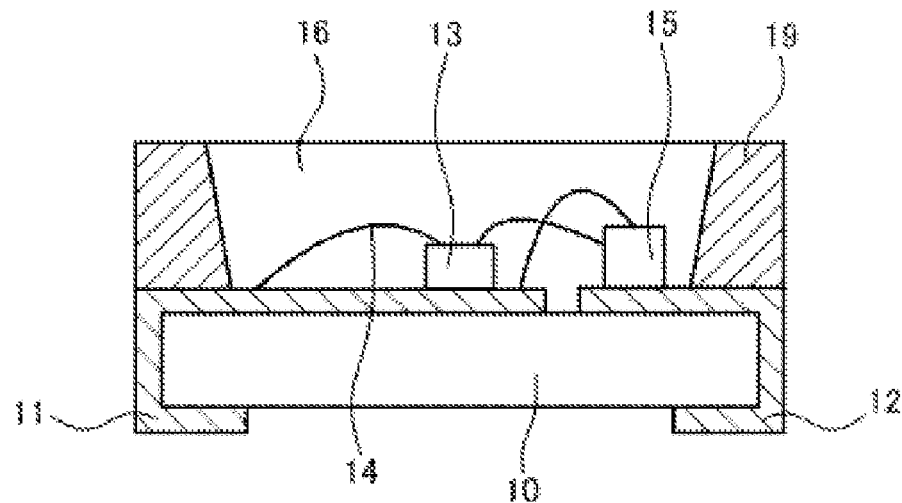
FIGS. 8(A) and (B) are a cross-section view depicting an exemplary conventional LED device and a circuit diagram thereof, respectively.
Figure 8B:
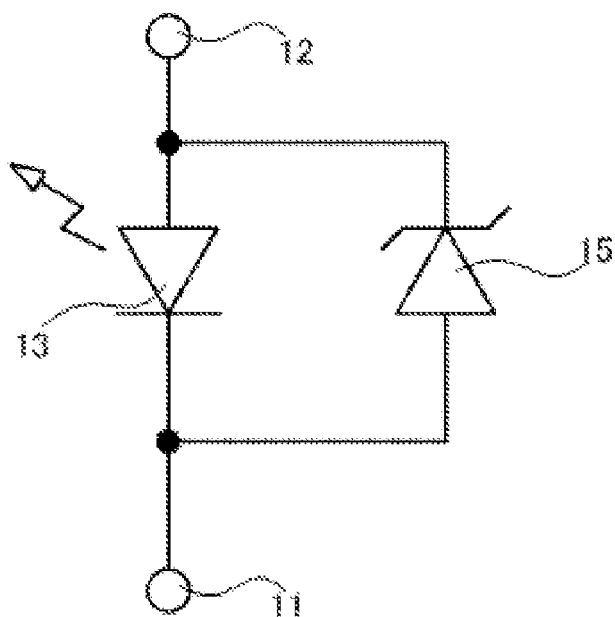
Figure 9A:
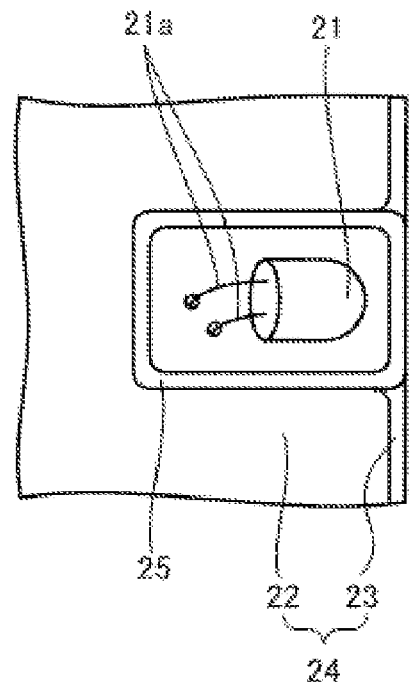
FIGS. 9(A) and (B) are a partial top view depicting an exemplary conventional protective device for an LED device and an exemplary variation thereof, respectively.
Figure 9B:
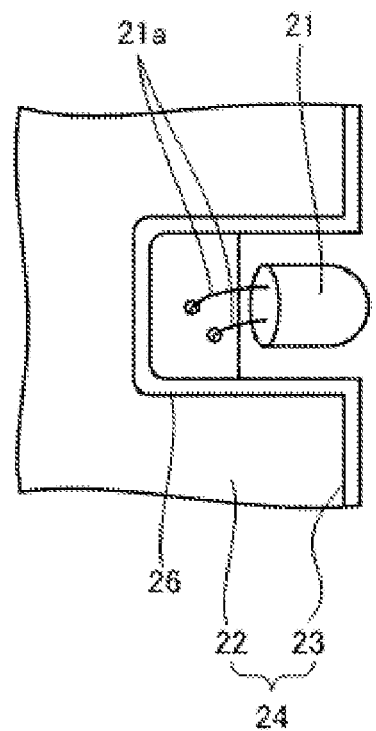

FIGS. 7(A) and (B) are respectively a schematic closeup front view and a schematic rear view of a portion of a variation of a light emitting device according to the second exemplary embodiment. A difference between the light emitting devices shown in FIGS. 6(A), (B) and 7(A), (B) is the number of the LED chip. The light emitting device shown in FIGS. 6(A), (B) can include a plurality of LED chips.

The light emitting device shown FIGS. 7(A), (B) can include one single LED chip. However, the light emitting device can emit white light using, for example, a blue LED chip 3B and an encapsulating resin 5 as described above, and also can emit other color light using an LED chip and the encapsulating resin 5 that is composed of a mixture resin.

As described above, the disclosed subject matter can provide a reliable light emitting device having a countermeasure against static electricity. The light emitting device can emit various color lights. In addition, the light emitting device is not required to be connected to a protective element such as in the conventional light emitting device, and also is not required to provide a protective device with the circuit board for use as a countermeasure against static electricity. Therefore, the light emitting device of the disclosed subject matter does not increase the size of the mounting portion and opens up more variations in terms of design and mounting position of the circuit board.

In the above-described embodiments, the conductor patterns 2 are formed on the resin based insulating board 1 via through holes. However, the conductor patterns 2 can alternatively be formed continuously via the side surfaces. In addition, lead frames and ceramic material generally used in other types of light emitting devices can be respectively used in place of the conductor patterns 2 and the insulating board 1 described above for use as the mounting board without departing from the spirit and scope of the presently disclosed subject matter.

It should be noted that the conductor pattern 2d can extend along a majority of a top edge of the top surface 1c of the insulating board and can be substantially parallel with the top edge of the top surface 1c of the insulating board. In addition, the conductor pattern 2d can extend towards the top edge of the top surface 1c and then turn at an angle so as to follow the top edge of the top surface 1c. The top edge of the top surface 1c can extend from a left side surface of the insulating board 1 to a right side surface of the insulating board 1.

While there has been described what are at present considered to be exemplary embodiments of the invention, it will be understood that various modifications may be made thereto, and it is intended that the appended claims cover such modifications as fall within the true spirit and scope of the invention. All conventional art references described above and their English counterparts are herein incorporated in their entirety by reference.

What is claimed is:

1. A light emitting device comprising:
    an insulating board having a mounting surface, a front surface, and a rear surface, both the front surface and the rear surface being substantially perpendicular to the mounting surface;
    a first conductor pattern having a cathode electrode and an anode electrode formed on the front surface of the insulating board, and the first conductor pattern extending substantially to the mounting surface on at least one of the front surface and the rear surface of the insulating board so as to be exposed close to the mounting surface for receiving a power supply;
    at least one second conductor pattern having a cathode electrode and an anode electrode formed on the front surface of the insulating board, and the at least one second conductor pattern extending substantially to the mounting surface on at least one of the front surface and the rear surface of the insulating board so as to be exposed close to the mounting surface for receiving a power supply;
    a first LED chip having an electrostatic breakdown voltage and mounted on the front surface of the insulating board, the first LED chip including a cathode and an anode and being a red LED chip that is composed of an AlGaInP-based compound semiconductor, and the cathode of the first LED chip electrically connected to the cathode electrode of the first conductor pattern, and the anode of the first LED chip electrically connected to the anode electrode of the first conductor pattern;
    at least one second LED chip having an electrostatic breakdown voltage and mounted on the front surface of the insulating board, the at least one second LED chip including a cathode and an anode and being at least one of a blue LED chip and a green LED chip that are composed of an GaN-based compound semiconductor, the cathode of the at least one second LED chip electrically connected connected to the cathode electrode of the at least one second conductor pattern, and the anode of the at least one second LED chip electrically connected to the anode electrode of the at least one second conductor pattern; and an encapsulating resin located so as to encapsulate both the first LED chip and the at least one second LED chip on the front surface of the insulating board, wherein the electrostatic breakdown voltage of the first LED chip is higher than the electrostatic breakdown voltage of the at least one second LED chip, and at least part of one electrode of the first conductor pattern is located at a position that is further from the mounting surface of the insulating board than a portion of the at least one second conductor pattern that is furthest, relative to all other portions of the at least one second conductor pattern, from the mounting surface of the insulating board.

2. The light emitting device according to claim 1, wherein the encapsulating resin is composed of at least one of a transparent resin and a mixture resin, and the mixture resin includes a resin mixed with at least one of a diffuser, a phosphor, and a pigment for selectively absorbing light having a predetermined wavelength.

3. The light emitting device according to claim 1, wherein the at least part of the first conductor pattern that is located at a farther position from the mounting surface of the insulating board than a furthest portion of the at least one second conductor pattern, is exposed to atmosphere and not encapsulated with resin.

4. The light emitting device according to claim 1, wherein the at least part of one electrode of the first conductor pattern is the cathode electrode, and the cathode electrode of the first conductor pattern is connected to ground of a power supply.

5. The light emitting device according to claim 4, wherein the encapsulating resin is composed of at least one of a transparent resin and a mixture resin, and the mixture resin includes a resin mixed with at least one of a diffuser, a phosphor, and a pigment for selectively absorbing light having a predetermined wavelength.

6. The light emitting device according to claim 1, wherein the first LED chip that is connected to the first conductor pattern is electrically independent with respect to the at least one second LED chip that is connected to the at least one second conductor pattern.

7. The light emitting device according to claim 6, wherein the encapsulating resin is composed of at least one of a transparent resin and a mixture resin, and the mixture resin includes a resin mixed with at least one of a diffuser, a phosphor, and a pigment for selectively absorbing light having a predetermined wavelength.

8. The light emitting device according to claim 6, wherein the at least part of one electrode of the first conductor pattern is the cathode electrode, and the cathode electrode of the first conductor pattern is connected to ground of a power supply.

9. The light emitting device according to claim 8, wherein the encapsulating resin is composed of at least one of a transparent resin and a mixture resin, and the mixture resin includes a resin mixed with at least one of a diffuser, a phosphor, and a pigment for selectively absorbing light having a predetermined wavelength.

10. A light emitting device comprising:

an insulating board having a mounting surface, a front surface, and a rear surface, both the front surface and the rear surface being substantially perpendicular to the mounting surface;

a first conductor pattern formed on the front surface of the insulating board, and the first conductor pattern extending substantially to the mounting surface on at least one of the front surface and the rear surface of the insulating board so as to be exposed close to the mounting surface for electrical connection to ground of a power supply;

at least one second conductor pattern having a cathode electrode and an anode electrode formed on the front surface of the insulating board, and the at least one second conductor pattern extending substantially to the mounting surface on at least one of the front surface and the rear surface of the insulating board so as to be exposed close to the mounting surface for receiving a power supply;

at least one LED chip mounted on the front surface of the insulating board, a cathode of the at least one LED chip electrically connected to the cathode electrode of the at least one second conductor pattern, and an anode of the at least one LED chip electrically connected to the anode electrode of the at least one second conductor pattern; and an encapsulating resin located so as to encapsulate the at least one LED chip on the front surface of the insulating board, wherein the first conductor pattern is connected to neither the cathode nor the anode of the at least one LED, and at least part of the first conductor pattern is located at a farther position from the mounting surface of the insulating board than a furthest portion of the at least one second conductor pattern that is further than any other portion of the at least one second conductor pattern with respect to the mounting surface of the insulating board.

11. The light emitting device according to claim 10, wherein the encapsulating resin is composed of at least one of a transparent resin and a mixture resin, and the mixture resin includes a resin mixed with at least one of a diffuser, a phosphor, and a pigment for selectively absorbing light having a predetermined wavelength.

12. The light emitting device according to claim 10, wherein the first conductor pattern is connected to ground of a power supply via a circuit board and the at least one LED chip is composed of a GaN-based compound semiconductor.

13. The light emitting device according to claim 12, wherein the encapsulating resin is composed of at least one of a transparent resin and a mixture resin, and the mixture resin includes a resin mixed with at least one of a diffuser, a phosphor, and a pigment for selectively absorbing light having a predetermined wavelength.

* * * * *